(12) United States Patent
Colburn et al.

(10) Patent No.: US 7,993,815 B2
(45) Date of Patent: Aug. 9, 2011

(54) LINE ENDS FORMING

(75) Inventors: Matthew E. Colburn, Hopewell Junction, NY (US); Allen H. Gabor, Katonah, NY (US); Scott D. Halle, Hopewell Junction, NY (US); Donald J. Samuels, Silverthorne, CO (US)

(73) Assignee: International Business Machines Corporation, Armonk, NY (US)

( * ) Notice: Subject to any disclaimer, the term of this patent is extended or adjusted under 35 U.S.C. 154(b) by 979 days.

(21) Appl. No.: 11/853,353

(22) Filed: Sep. 11, 2007

(65) Prior Publication Data

US 2009/0068837 A1 Mar. 12, 2009

(51) Int. Cl.
*H01L 21/8229* (2006.01)
(52) U.S. Cl. ........................................ 430/311; 438/294
(58) Field of Classification Search ......................... None
See application file for complete search history.

(56) References Cited

U.S. PATENT DOCUMENTS

2006/0113522 A1 6/2006 Lee et al.
2007/0267695 A1 11/2007 Lee

OTHER PUBLICATIONS

U.S. Appl. No. 11/853,358, filed Sep. 11, 2007, Office Action dated Jul. 24, 2009.
U.S. Appl. No. 11/853,358, filed Sep. 11, 2007, Final Office Action dated Dec. 24, 2009.

*Primary Examiner* — Daborah Chacko-Davis
(74) *Attorney, Agent, or Firm* — Steven Capella; Hoffman Warnick LLC (57) ABSTRACT

Methods of forming line ends and a related memory cell including the line ends are disclosed. In one embodiment, the method includes forming a first device element and a second device element separated from the first device element by a space; and forming a first line extending from the first device element, the first line including a bulbous line end over the space and distanced from the first device element, and a second line extending from the second device element, the second line including a bulbous line end over the space and distanced from the second device element.

13 Claims, 6 Drawing Sheets

LINE ENDS FORMING

CROSS REFERENCE TO RELATED APPLICATIONS

This application is related to a concurrently filed U.S. patent application Ser. No. 11/853,358, which is assigned to the same assignee of the present application and whose content is incorporated herein by reference in its entirety.

BACKGROUND

1. Technical Field

The disclosure relates generally to integrated circuit (IC) chip fabrication, and more particularly, to methods of forming line ends in a material in an IC and a memory cell including the line ends.

2. Background Art

Memory used in integrated circuit (IC) chips can come in a variety of forms such as static random access memory (SRAM), dynamic random access memory (DRAM), flash memory, etc. In order to produce the highest performing memory cells within a specific cell size it is necessary to increase the device widths as much as possible. As the device widths are increased, the width of the isolation regions (e.g., shallow trench isolation (STI)) between the active areas of the device is decreased. The minimization of the width of the isolation regions is not limited by the ability to print the active region pattern, but from the ability to place two polysilicon conductor (polyconductor or PC) line ends end-to-end (facing each other or otherwise) on the isolation region. Thus, the performance of a memory cell is directly influenced by the tip to tip space that can be achieved between PC line ends.

Figure 1:
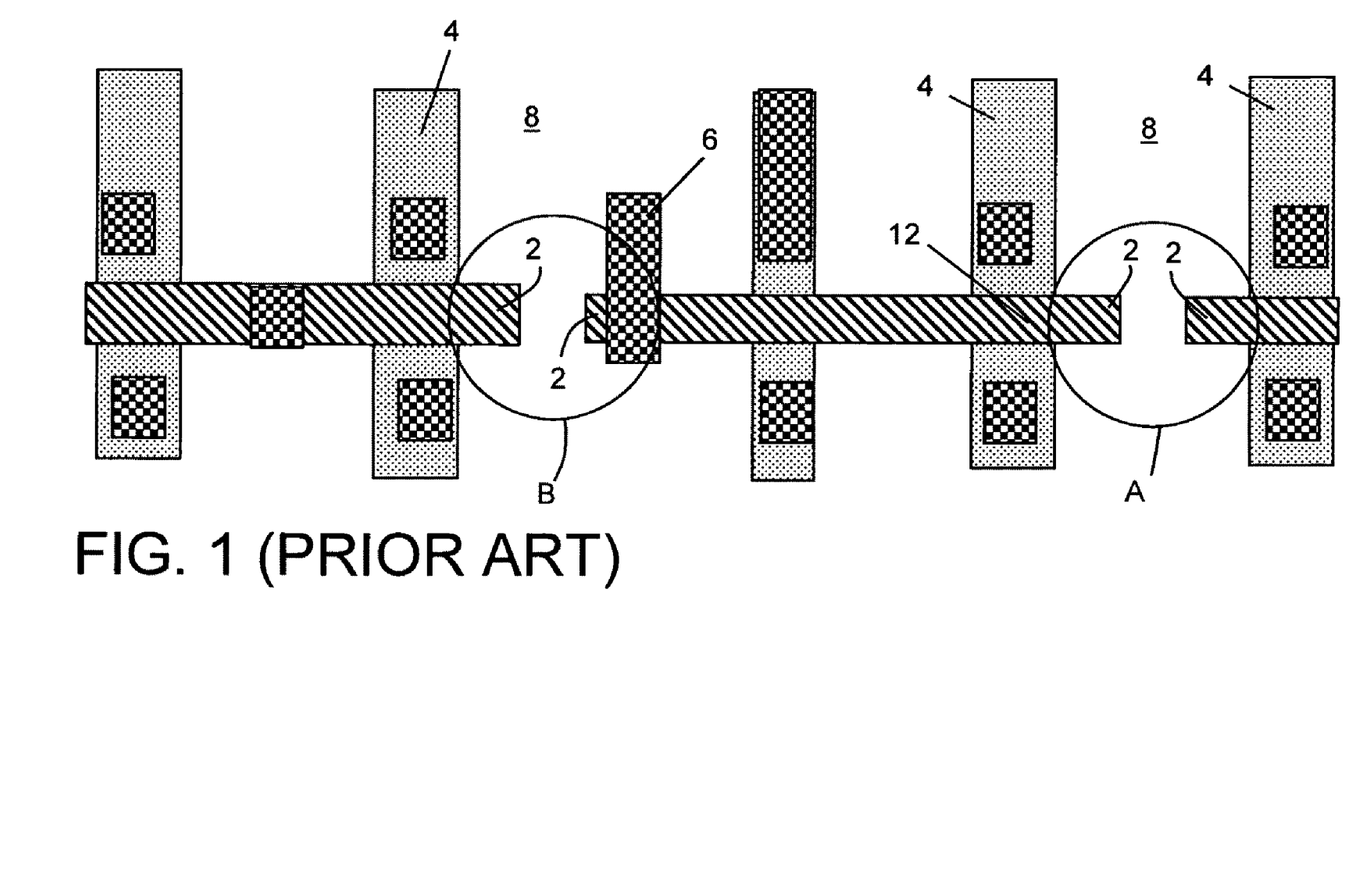
FIG. 1 shows a simplified conventional memory (SRAM) cell.

The ability to pattern a small space between PC line ends has both lithographic and etch limitations. The etch limitations come from the fact that during the trim step (i.e., the process in which the gate critical dimension (CD) that was printed in photoresist is reduced to that which is needed in the final polysilicon) the line ends trim more than the gates. In particular, as shown in FIG. 1, a specific PC line end 2 may be targeted to be, for example, 100 nm past an active region 4 into an isolation region 8 (scenario A both sides and scenario B, left side only) or make good contact with contact layer 6 (scenario B, right side only), but due to limitations of the resist, trim processing and rounding, PC line end 2 does not end up being 100 nm past the active region 4 or contact layer 6.

Figure 2:
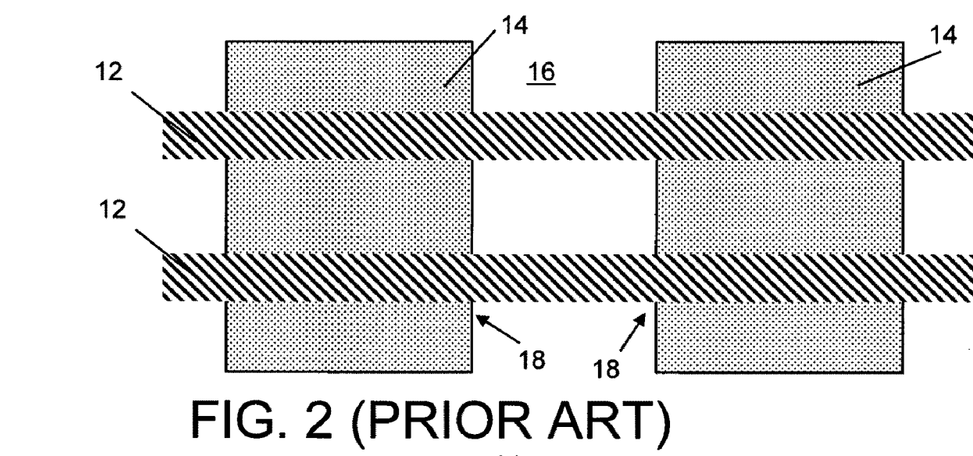
FIGS. 2-3 show a simplified method of forming line ends for a memory cell.
Figure 3:
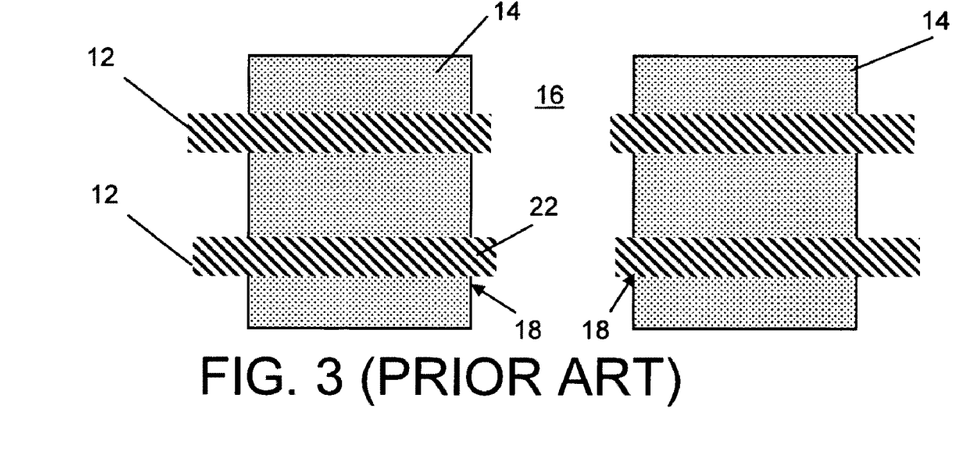

There are many methods which are being pursued in the industry to enable the tighter PC line end spacing. For example, one popular approach includes a double exposure-double etch scheme. In this case, as shown in FIG. 2, a polyconductor (PC) 12 is exposed and etched over an active region 14 and fully across an isolation region 16 to print a gate 18 (intersection of PC 12 and active region 14), and then another exposure and etch, shown in FIG. 3, is used to remove polyconductor 12 over the isolation region 16 to form line ends 22 and, hence, the devices. The approach allows the etch step for opening line ends 22 to be completely directional (no trim) and also creates PC tips that are relatively rectangular. While attaining the necessary sizes and precision, however, the cost incurred is significant because of the need for two exposures and two etches for one level.

A second approach includes using a double exposure with a single etch. While this approach does not eliminate the etch effects, it allows for a smaller line end space to be printed in resist, if the illumination is optimized for the second exposure. An optimized version of this approach exposes the PC using an alternating phase shift masks (Alt PSM) scheme and a block/trim mask to print the space between the line ends.

SUMMARY

Methods of forming line ends and a related memory cell including the line ends are disclosed. In one embodiment, the method includes forming a first device element and a second device element separated from the first device element by a space; and forming a first line extending from the first device element, the first line including a bulbous line end over the space and distanced from the first device element, and a second line extending from the second device element, the second line including a bulbous line end over the space and distanced from the second device element.

A first aspect of the disclosure provides a method comprising: forming a first device element and a second device element separated from the first device element by a space; and forming a first line extending from the first device element, the first line including a bulbous line end over the space and distanced from the first device element, and a second line extending from the second device element, the second line including a bulbous line end over the space and distanced from the second device element.

A second aspect of the disclosure provides a memory cell comprising: a first device having a first conductive line extending over a first active region and having a first line end of the first conductive line positioned over an isolation region adjacent to the first active region; and a second device having a second conductive line extending over one of a second active region and a contact element and having a second line end of the second conductive line positioned over the isolation region adjacent to the one of the second active region and the contact element, wherein the first line end and the second line end each include a bulbous end that is distanced from a respective active region or contact element.

A third aspect of the disclosure provides a method comprising: providing a design including a first line extending from a first device element and a second line extending from a second device element, the first and second line having ends separated by an isolation region; forming a material layer to be etched by an etch mask; preparing the etch mask for the design in which the two lines are connected by a false bulged region pattern, the false bulged region pattern having a dimension greater than that of the two lines; adjusting the etch mask to separate the two lines through the false bulged region pattern, leaving an outer portion of the false bulged region pattern; and etching the material layer using the etch mask to form the first line and the second line from the material layer, each line including a bulbous line end over the isolation region that is distanced from a respective device element.

A fourth aspect of the disclosure provides a method comprising: forming a conductive layer over a first and second device element separated by an isolation region; forming an etch mask over the conductive layer including a line pattern and a false bulged region pattern, the false bulged region pattern positioned at a distance from an edge of the first and second device elements; adjusting the etch mask over the conductive layer to separate the line pattern into two separate line patterns through the false bulged region pattern, leaving an outer portion of the false bulged region pattern; and etching the conductive layer using the etch mask to form a first line and a second line, each line including a bulbous line end over the isolation region that is distanced from a respective device element.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Referring to FIGS. 4A-E, embodiments of a method of forming line ends as it pertains to forming a memory cell 200 (FIG. 4E) are illustrated. Relative to memory cell 200 (FIG. 4E), line ends are conductive (e.g., polyconductor) and extend from a device element in the form of an active region (e.g., silicon). It is understood, however, that the teachings of the disclosure are not limited to formation of line ends for a memory cell, and may find applicability to a variety of situations requiring decreased spacing between line ends. That is, the illustrative setting should not be considered limiting since the teachings of the disclosure are applicable to forming line ends in any material requiring decreased spacing between line ends thereof. For example, the lines may include any material used in an IC such as a conductor (e.g., copper, aluminum, polysilicon conductor (PC)), an active region (e.g., silicon), a dielectric (e.g., silicon dioxide, silicon nitride, etc.) or other material. It is also emphasized here that the teachings of the disclosure are apart from optical proximity correction, which may also be provided.

Figure 4A:
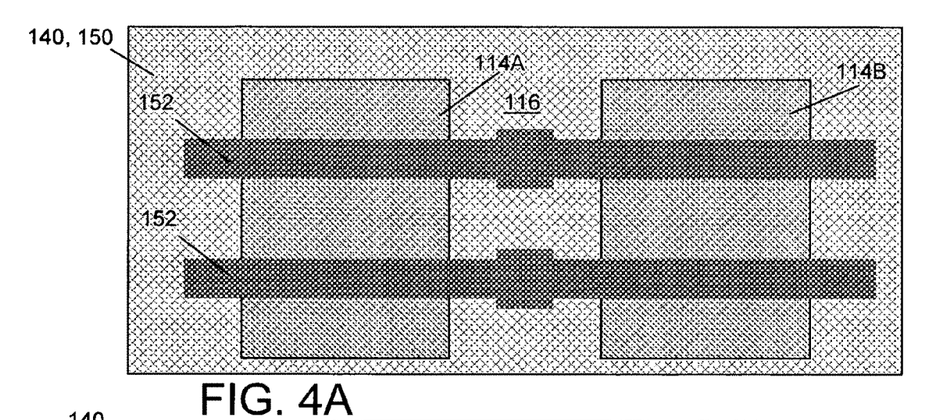
FIGS. 4A-E show embodiments of a method according to the disclosure.

FIG. 4A shows forming a first device element 114A and a second device element 114B separated from first device element 114B by a space 116, which is an isolation region in the illustrative memory cell setting. As used herein, a "device element" may include any structure over which a line is to extend. As noted above, in one embodiment, each device element 114A, 114B includes an active region, i.e., a doped silicon region, over which a conductive line 112A, 112B (FIG. 4E) (two shown) forms a device (gate) 118. In another embodiment, a line end of one device element 114A may only need to pass over the active region onto space 116 (hereinafter "isolation region 116"), while device element 114B needs to make contact with a contact element, e.g., a contact via or contact level interconnect (similar to contact layer 6 in FIG. 1). Other device elements may also be possible. Isolation region 116 may include any now known or later developed isolation structure, e.g., a deep trench isolation, a shallow trench isolation, and may include any appropriate dielectric such as silicon dioxide ($SiO_2$). Device elements 114A, 114B and isolation region 116 may be formed using any now known or later develop processes, e.g., silicon deposition, trench formation using photolithography, dielectric deposition, planarization, etc.

With initial reference to FIG. 4E, FIGS. 4B-4E show forming a first device 118A having a first line 112A (two shown) extending from first device element 114A over isolation region 116 and a second device 118B having a second line 112B extending from second device element 114B over isolation region 116. Each line 112A, 112B includes a bulbous line end 130A, 130B distanced from a respective device element 114A, 114B, respectively. While two sets of lines 112A, 112B (FIG. 4E) are shown, it is understood that any number of line sets and, hence, devices 118A, 118B, may be formed using the teachings of the disclosure.

Turning to FIG. 4A, formation of first and second devices 118A, 118B may include forming a material layer 140 (e.g., a conductor such as a metal or polyconductor in the setting of a memory cell) over first and second device elements 114A, 114B and isolation region 116. FIG. 4A also shows a photoresist layer 150 over material layer 140. (Both material layer 140 and photoresist layer 150 are shown in a transparent manner so that underlying structures are apparent). Where material layer 140 includes a polysilicon conductor (PC), the PC may include any now known or later developed polycrystalline silicon conductor material, doped or undoped.

Figure 4B:
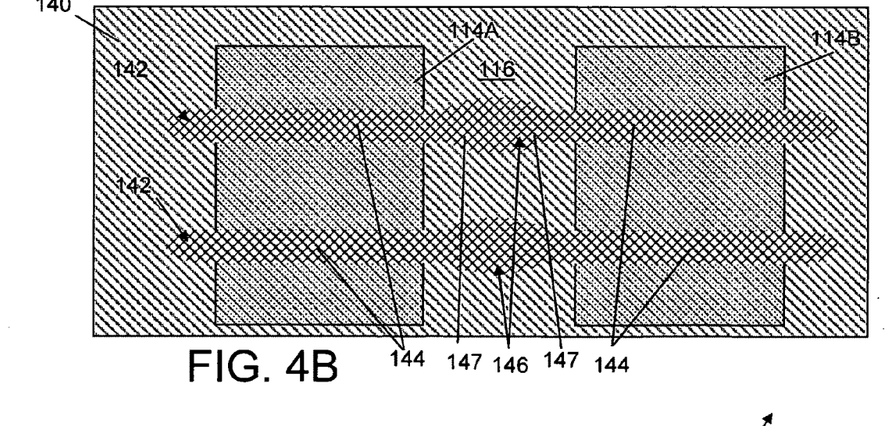

FIGS. 4A-B also shows forming an etch mask 142 (FIG. 4B) from photoresist 150 over material layer 140 including a line pattern 144 and a false bulged region pattern 146. FIG. 4A shows a positive tone mask 152 for patterning photoresist 150 (FIG. 4B). Mask 152 includes portions for forming line patterns 144 and false bulged region patterns 146 as shown in FIG. 4B. False bulged region pattern 146 is referred to as "false," as will become apparent herein, because the structure is ultimately removed; that is, false bulged region pattern 146 is not in the original design, but is placed to connect line ends that are intended to be separated. Mask 152 is used to etch photoresist 150 in a conventional manner, resulting in etch mask 142. In contrast to conventional techniques, false bulged region pattern 146 is positioned at a distance from edges of device elements 114A, 114B to ensure that resulting bulbous line ends 130 (FIG. 4E) do not impinge first and second device elements 114A, 114B. In one embodiment, a distance that bulbous line end 130 (FIG. 4E) extends beyond a device element 114A, 114B can be determined according to an algorithm. For example, the following algorithm may be employed for a PC line end extending over an active region:

$$D = \sqrt{(PCRX\_OL)^2 + (PC\_tolerance)^2 + ((0.5)RX\_tolerance)^2}$$

where D is the distance of the bulbous line end from the active region, PCRX_OL is an overlay tolerance error between an intended placement of the line end and what actually occurs, PC_tolerance is a variation in critical dimension of a gate formed by the line and the active region around nominal and RX_tolerance is a variation in critical dimension of one side of the active region. Each of the values are a three standard deviation values ($3\sigma$).

As noted above, however, false bulged region pattern 146 does not provide optical proximity correction, which may be provided by other conventional techniques. In the embodiments described herein, alternating phase shift masks (Alt PSM) (for gates), attenuated phase shift masks (Attn PSM) and/or chrome-on-glass masks may be employed.

Figure 4C:
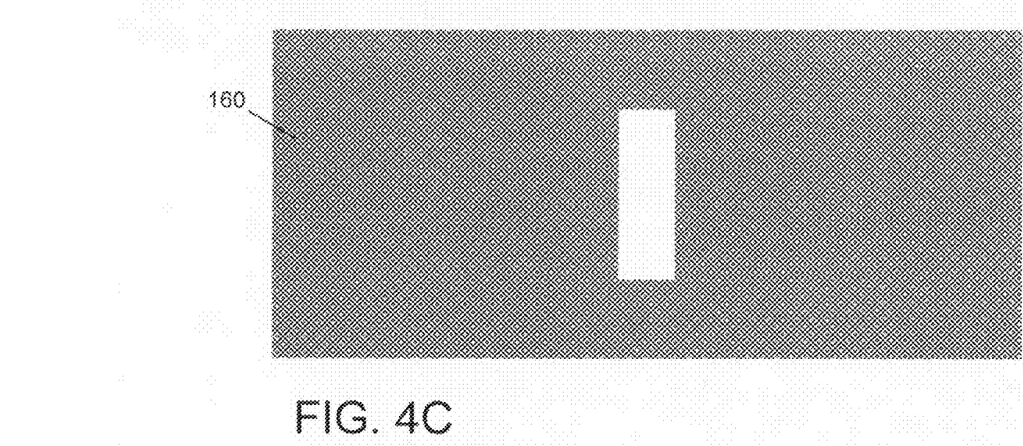
Figure 4D:
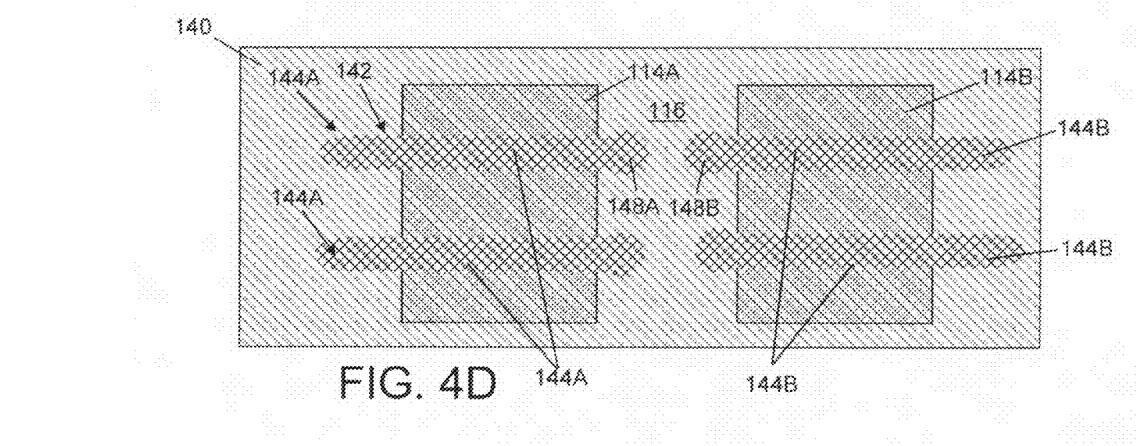

FIGS. 4C-D show adjusting etch mask 142 over material layer 140 to separate the line pattern 144 into two separate line patterns 144A, 144B through a portion of false bulged region pattern 146 (FIG. 4B), leaving an outer portion 147 (FIG. 4B) of false bulged region pattern 146. FIG. 4C shows a cut mask 160 used to remove a portion of etch mask 142 (FIG. 4B) through false bulged region pattern 146 (FIG. 4B) by etching, e.g., reactive ion etch of mask layer 142. FIG. 4D shows adjusted etch mask 142 including separate line patterns 144A, 144B and bulbous line patterns 148A, 148B.

Figure 4E:
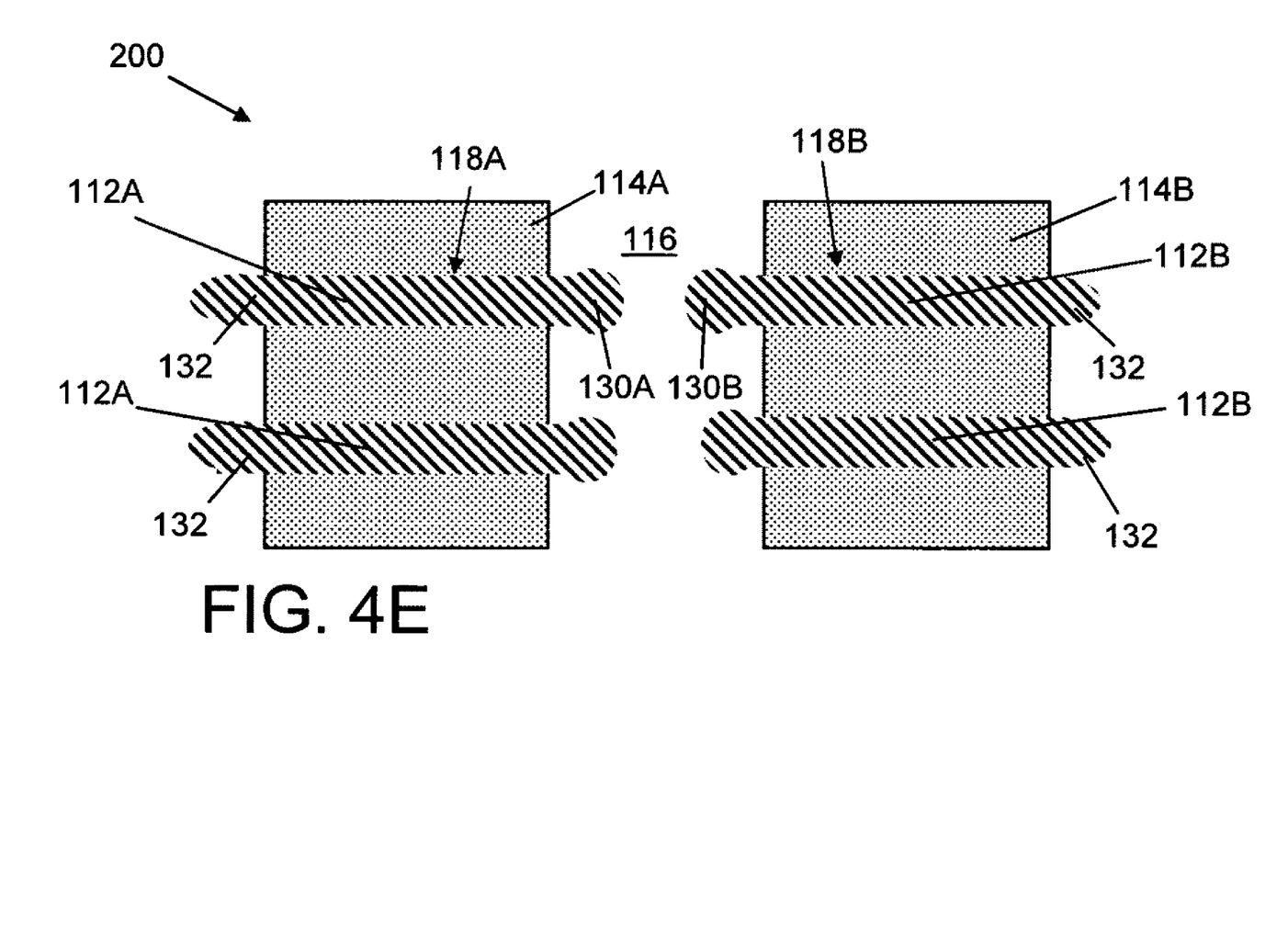
Figure 5A:
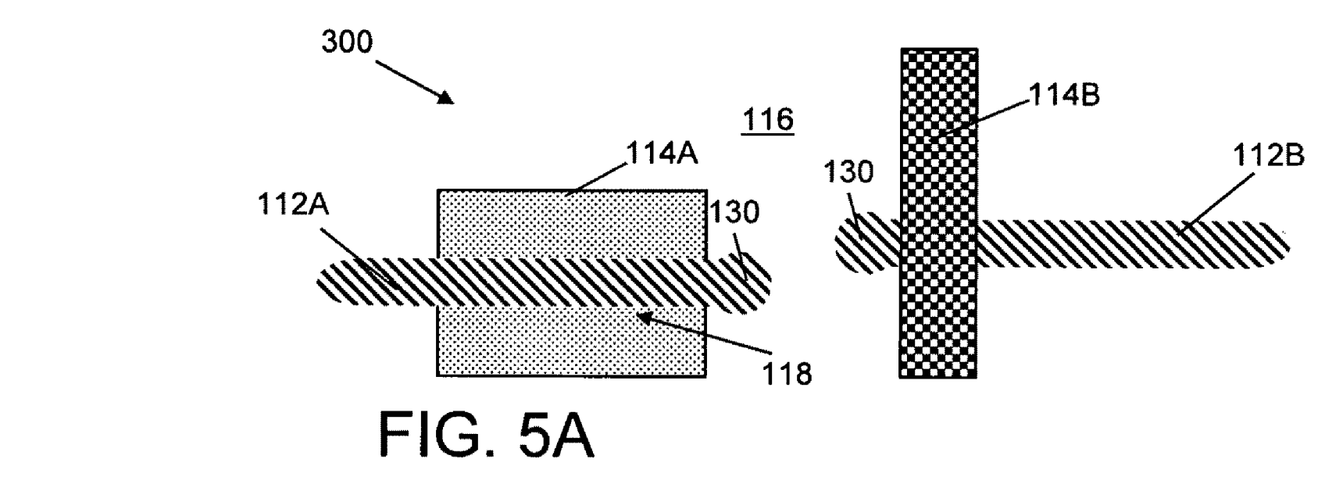
FIGS. 5A-B show alternative embodiments of line ends according to the disclosure.
Figure 5B:
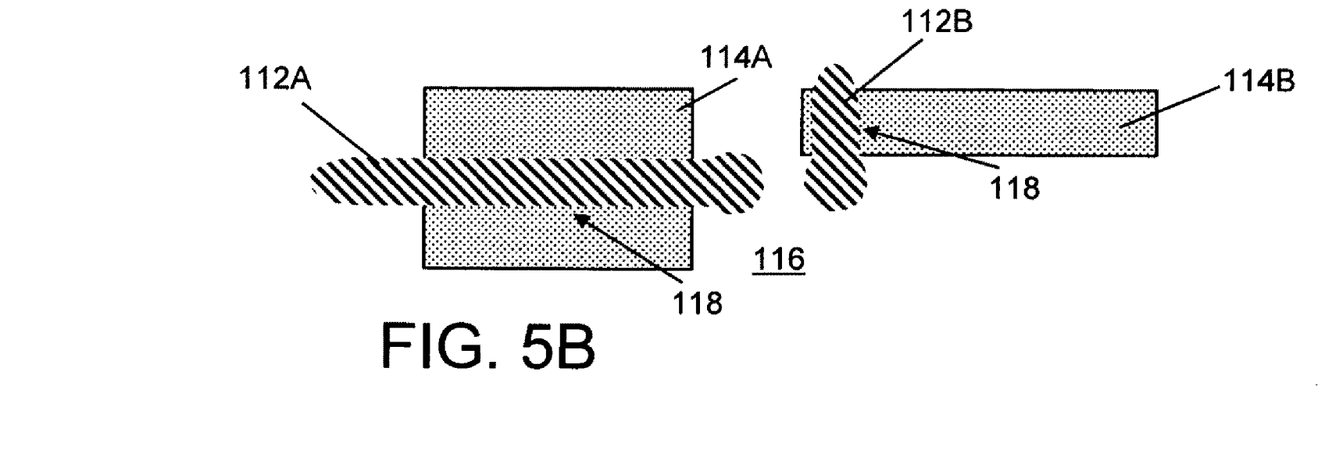

FIG. 4E shows the results of etching material layer 140 using etch mask 142 (FIG. 4C) to form first and second lines 112A, 112B and bulbous line ends 130. During etching, bulbous line ends 130 etch at a slower rate than compared to opposite ends 132 of lines 112A, 112B. FIG. 4E shows one embodiment in which first line 112A and second line 112B are substantially aligned end-to-end. However, as shown in FIGS. 5A-B, in alternative embodiments, lines 112A, 112B may be misaligned (FIG. 5A) or may be substantially perpendicular to one another (FIG. 5B). Other configurations may also be possible and are considered within the scope of the disclosure.

The above-described embodiments may be employed relative to form a memory cell 200, 300. In this case, memory cell 200, 300 may constitute static random access memory (SRAM), dynamic random access memory (DRAM) or flash memory. As shown in FIG. 4E, memory cell 200 may include a first device 118A having a first conductive line 112A extending over first active region 114A and having a first line end 130 of the first conductive line positioned over isolation region 116 adjacent to first active region 114A. Memory cell 200 may also include a second device 118B having second conductive line 112B extending over second active region 114B and having second line end 130 of the second conductive line positioned over isolation region 116 adjacent to second active region 114B. As described above, line ends 130 each include a bulbous end that is distanced from a respective active region 114A, 114B.

As shown in FIG. 5A, memory cell 300 may include memory cell 200 may include a first device 118A having first conductive line 112A extending over first active region 114A and having a first line end 130 of the first conductive line positioned over isolation region 116 adjacent to first active region 114A. Memory cell 200 may also include a second device 118B having second conductive line 112B extending over second active region 114B and having second line end 130 of the second conductive line positioned over isolation region 116 adjacent to second active region 114B. As described above, line ends 130 each include a bulbous end that is distanced from a respective active region 114A, 114B. FIG. 5B shows a similar memory cell 300 as memory cell 200, except in this case, second device element 114B includes a contact element 170.

It is understood that the above embodiments may be employed in a more general sense. In this case, the methodology may include providing a design (similar to that shown in FIG. 4) including a first line extending from a first device element 114A and a second line extending from a second device element 114B, the first and second line having ends separated by an isolation region. An etch mask 142 for the design in which the two lines are connected by a false bulged region pattern 146, the false bulged region pattern having a dimension greater than that of the two lines, may then be prepared. Etch mask 142 may then be adjusted to separate the two lines through false bulged region pattern 146, leaving an outer portion 147 of the false bulged region pattern. A material layer 140 (not necessarily conductive) may then be formed and etched using etch mask 142 to form first line 112A and second line 112B, each line including a bulbous line end 130 over isolation region 116 that is distanced from a respective device element 114A, 114B.

The above-described disclosure above allows both the etch rate (FIG. 4E) for bulged line ends 130 to be decreased by creating a bulge line pattern 148A, 148B and the illumination to be optimized for line end imaging through double exposure. The use of double exposure has the benefit of moving bulged line ends 130 away from the resulting devices 118A, 118B, thus decreasing device length variation. Because the double exposure is done in one pass through the exposure tool and only requires one etch step it is significantly cheaper to exercise than the conventional double expose-double etch technique.

The methods and structure as described above are used in the fabrication of integrated circuit chips and/or memory chips. The resulting integrated circuit chips or memory chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips or memory chips, ranging from toys and other low-end applications to advanced computer products having a display, a keyboard or other input device, and a central processor.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. A method comprising:
   forming a first device element and a second device element separated from the first device element by a space;
   forming a first line extending from the first device element, the first line including a bulbous line end over the space and distanced from the first device element, and
   forming a second line extending from the second device element, the second line including a bulbous line end over the space and distanced from the second device element,
   wherein the bulbous line end of the first line and the bulbous line end of the second line are formed substantially simultaneously and are aligned facing one another.

2. The method of claim 1, wherein the first and second device forming includes:
   forming a material layer over the first and second device elements;
   forming an etch mask over the material layer including a line pattern and a false bulged region pattern;
   adjusting the etch mask over the material layer to separate the line pattern into two separate line patterns through a portion of the false bulged region; and
   etching the material layer using the etch mask to substantially simultaneously form the lines and the bulbous line ends, wherein the etching of the material layer at the bulbous line ends is performed at a substantially slower rate than the etching of the material layer at other portions of the material layer.

3. The method of claim 2, wherein the false bulged region pattern is positioned at a distance from an edge of the first and second device element to ensure that resulting bulbous line ends do not impinge the first and second device elements.

4. The method of claim 3, wherein the material layer includes a polysilicon conductor and each device element includes an active region, wherein the distance is determined according to the following:

$$D = \sqrt{(PCRX\_OL)^2 + (PC\_tolerance)^2 + ((0.5)RX\_tolerance)^2}$$

where D is the distance of the bulbous line end from the active region, PCRX_OL is an overlay tolerance error between an intended placement of the line end and what actually occurs, PC_tolerance is a variation in critical dimension of a gate formed by the line and the active region around nominal and RX_tolerance is a variation in critical dimension of one side of the active region.

5. The method of claim 2, wherein the false bulged region pattern does not provide optical proximity correction.

6. The method of claim 5, wherein the first and second device forming includes using at least one of the following to provide for optical proximity correction during the forming: alternating phase shift masks (Alt PSM) or attenuated phase shift masks (Attn PSM) or chrome-on-glass masks.

7. The method of claim 1, wherein the first device element includes an active region and the second device element includes a contact element.

8. The method of claim 1, wherein the first device element and the second device element each include an active region.

9. A method comprising:
forming a first device element and a second device element, the second device element being separated from the first device element by a space; and
forming a material layer over the first and second device elements;
forming an etch mask over the material layer including a single line pattern and a false bulged region pattern, wherein the false bulged region pattern does not provide optical proximity correction;
adjusting the etch mask over the material layer to separate the single line pattern into two separate line patterns through a portion of the false bulged region;
etching the material layer using the etch mask to form:
a first line extending from the first device element, the first line including a bulbous end located over the space between the first device element and the second device element,
wherein the bulbous end of the first line is separated from the first device element; and
a second line extending from the second device element, the second line including a bulbous end located over the space between the first device element and the second device element,
wherein the bulbous end of the second line is separated from the second device element.

10. The method of claim 9, wherein the false bulged region pattern is positioned at a distance from an edge of the first and second device element to ensure that resulting bulbous line ends do not impinge the first and second device elements.

11. The method of claim 10, wherein the material layer includes a polysilicon conductor and each device element includes an active region, wherein the distance is determined according to the following:

$$D = \sqrt{(PCRX\_OL)^2 + (PC\_tolerance)^2 + ((0.5)RX\_tolerance)^2}$$

where D is the distance of the bulbous line end from the active region, PCRX_OL is an overlay tolerance error between an intended placement of the line end and what actually occurs, PC_tolerance is a variation in critical dimension of a gate formed by the line and the active region around nominal and RX_tolerance is a variation in critical dimension of one side of the active region.

12. The method of claim 9, wherein the first line and the second line are substantially perpendicular to one another.

13. A method comprising:
forming a first device element and a second device element separated from the first device element by a space;
forming a precursor line extending between the first device element and the second device element over the space;
forming, from the precursor line, a first line extending from the first device element, the first line including a bulbous line end over the space and distanced from the first device element, and
forming, from the precursor line, a second line extending from the second device element, the second line including a bulbous line end over the space and distanced from the second device element,
wherein the bulbous line end of the first line and the bulbous line end of the second line are formed substantially simultaneously from the precursor line.

* * * * *